(12) United States Patent
K

(10) Patent No.: US 10,637,521 B1
(45) Date of Patent: Apr. 28, 2020

(54) 25% DUTY CYCLE CLOCK GENERATOR HAVING A DIVIDER WITH AN INVERTER RING ARRANGEMENT

(71) Applicant: TEXAS INSTRUMENTS INCORPORATED, Dallas, TX (US)

(72) Inventor: Prasanth K, Ottapalam (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/234,667

(22) Filed: Dec. 28, 2018

(30) Foreign Application Priority Data

Oct. 12, 2018 (IN) .............................. 201841038735

(51) Int. Cl.
| | |
|---|---|
| H04B 1/00 | (2006.01) |
| H04L 7/00 | (2006.01) |
| H04L 7/033 | (2006.01) |
| H04L 27/00 | (2006.01) |
| H04B 1/10 | (2006.01) |
| H03K 3/012 | (2006.01) |
| H03K 19/20 | (2006.01) |

(52) U.S. Cl.
CPC .......... *H04B 1/1027* (2013.01); *H03K 3/012* (2013.01); *H03K 19/20* (2013.01); *H04L 7/0087* (2013.01); *H04L 27/0002* (2013.01); *H04L 7/0331* (2013.01)

(58) Field of Classification Search
CPC ........................... H04B 1/30; H03K 3/356139
See application file for complete search history.

(56) References Cited

U.S. PATENT DOCUMENTS

2009/0191833 A1* 7/2009 Kaczman ................ H03F 1/301
455/296
2013/0015891 A1* 1/2013 Cicalini ........... H03K 3/356139
327/115

* cited by examiner

*Primary Examiner* — David S Huang
(74) *Attorney, Agent, or Firm* — John R. Pessetto; Charles A. Brill; Frank D. Cimino

(57) ABSTRACT

A receiver device includes an I-Q mixer circuit configured to provide an I-phase signal and a Q-phase signal. The receiver device also includes a first analog-to-digital converter (ADC) circuit configured to digitize the I-phase signal. The receiver device also includes a second ADC circuit configured to digitize the Q-phase signal. The receiver device also includes a 25% duty cycle clock generator configured to provide 25% duty cycle clock signals to the I-Q mixer. The 25% duty cycle clock generator includes a divider circuit with an inverter ring arrangement.

17 Claims, 7 Drawing Sheets

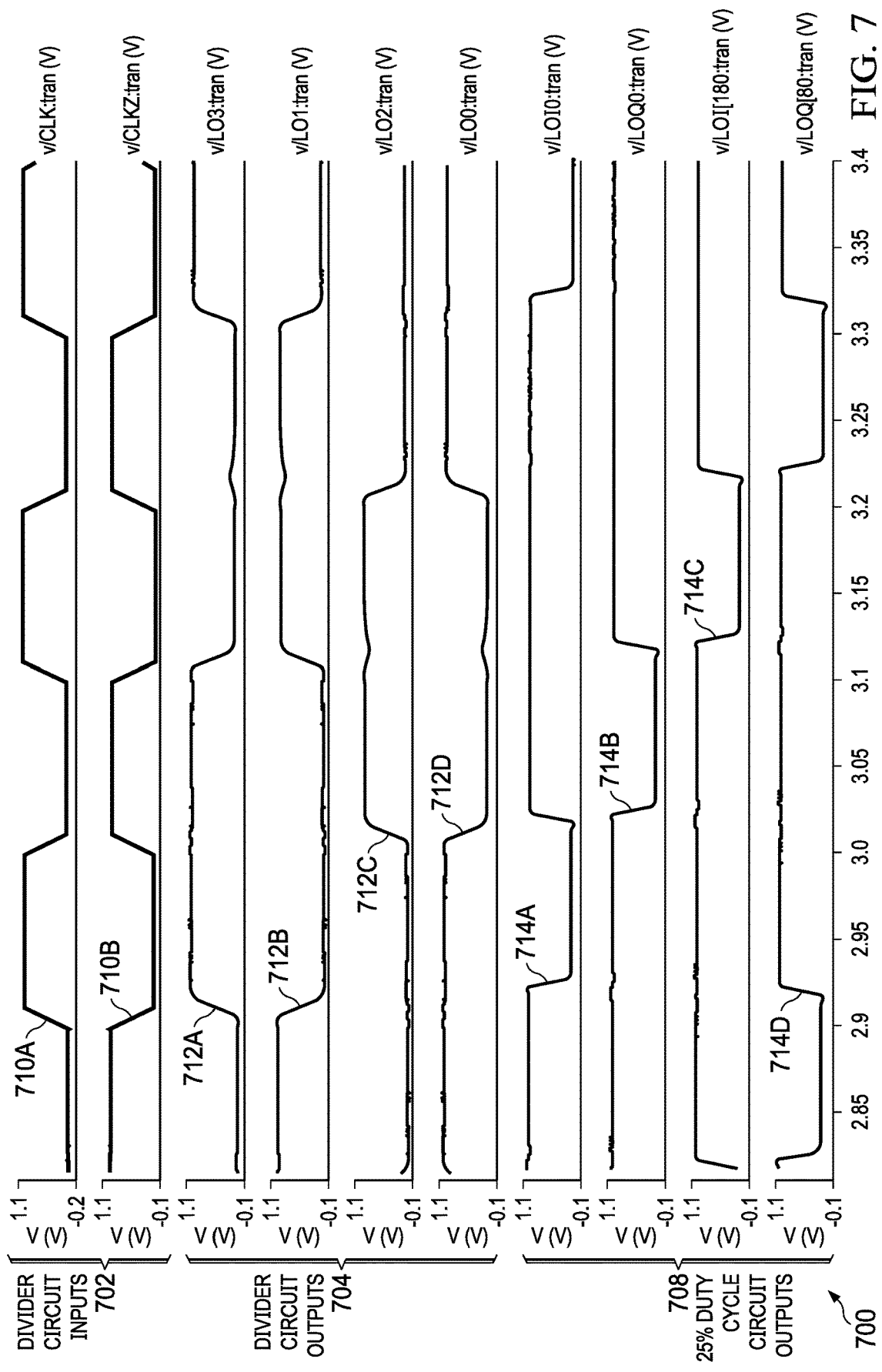

25% DUTY CYCLE CLOCK GENERATOR HAVING A DIVIDER WITH AN INVERTER RING ARRANGEMENT

RELATED APPLICATIONS

This application claims priority to an India Provisional Application No. 201841038735, filed Oct. 12, 2018, which is hereby incorporated by reference.

BACKGROUND

Modern electronics involve networked devices that transmit data, receive data, or both. An example transceiver includes both transmitter and receiver components. Example transmitter components provide an encoded data signal for a communication channel based on a transmitter clock signal. Likewise, example receiver components sample and decode a received signal from a communication channel based on a receiver clock signal. One example receiver component is a mixer that down-converts high frequency input signals (e.g., radio frequency (RF) signals) to lower frequency signal (intermediate frequency (IF) signals). In some receiver architectures, an I-Q mixer is used to differentiate positive and negative frequencies of an input signal. A passive current I-Q mixer uses 4 phases of the local oscillator (LO) clock for mixing operations. Some example architectures of clock generators for I-Q mixers have large power dissipation and/or phase noise issues.

SUMMARY

In accordance with at least one example of the disclosure, a receiver device comprising an I-Q mixer circuit configured to provide an I-phase signal and a Q-phase signal. The receiver device also comprises a first analog-to-digital converter (ADC) circuit configured to digitize the I-phase signal. The receiver device also comprises a second ADC circuit configured to digitize the Q-phase signal. The receiver device also comprises a 25% duty cycle clock generator configured to provide 25% duty cycle clock signals to the I-Q mixer. The 25% duty cycle clock generator comprises a divider circuit with an inverter ring arrangement.

In accordance with at least one example of the disclosure, a 25% duty cycle clock generator circuit comprises a divider circuit. The divider circuit comprises a first inverter, a second inverter, a third inverter, and a fourth inverter. An output node of the first inverter is coupled to an input of the second inverter. An output node of the second inverter is coupled to an input node of the third inverter. An output node of the third inverter is coupled to an input node of the fourth inverter. An output node of the fourth inverter is coupled to an input node of the first inverter.

BRIEF DESCRIPTION OF THE DRAWINGS

For a detailed description of various examples, reference will now be made to the accompanying drawings in which:

FIG. 7 is a timing diagram showing clocks signals related to a 25% duty cycle clock generator in accordance with various examples.

DETAILED DESCRIPTION

Disclosed herein are receiver devices, systems, and methods involving a 25% duty cycle clock generator topology having a divider circuit with an inverter ring arrangement. In some examples, the inverter ring arrangement includes a first inverter, a second inverter, a third inverter, and a fourth inverter, where an output node of the first inverter is coupled to an input of the second inverter, an output node of the second inverter is coupled to an input node of the third inverter, an output node of the third inverter is coupled to an input node of the fourth inverter, and an output node of the fourth inverter is coupled to an input node of the first inverter.

In some examples, the disclosed 25% duty cycle clock generator topologies also include a differential-to-single-ended converter (D2S) circuit with self-biased inverters, where the self-biased inverters are configured to convert a current mode logic (CML) input to rail-to-rail outputs. In operation, the D2S circuit converts a differential input clock signal into two single-ended clock signals. The two single-ended clock signals are provided to the divider circuit, which uses falling edges of the two single-ended clock signals to generate four 50% duty cycle clock signals.

In some examples, the disclosed 25% duty cycle clock generator topologies also include a 25% duty cycle circuit configured to generate 25% duty cycle clock signals based on rising edges of the 50% duty cycle clock signals output from the divider circuit. In other words, the rising and falling edges of the 25% duty cycle clock signals output from the 25% duty cycle circuit are based on the rising edges of the 50% duty cycle clock signals output from the divider circuit. With the disclosed 25% duty cycle clock generator topologies, 25% duty cycle clock signals (e.g., for use with an I-Q mixer) are generated with benefits such as lower power, better I-Q mismatch, better noise performance, better linearity, lower area and higher speed of operation compared to other 25% duty cycle clock generator topologies. In one example, the disclosed 25% duty cycle clock generator topologies are used in a Zero IF (ZIF) receiver scenario with Sigma Delta analog-to-digital converter (ADC) operations on the I-phase and Q-phase signals output from an I-Q mixer that performs mixing operations using 25% duty cycle clock signals from a 25% duty cycle clock generator as described herein. To provide a better understanding, various receiver options and 25% duty cycle clock generator topology options are described using the figures as follows.

Figure 1:
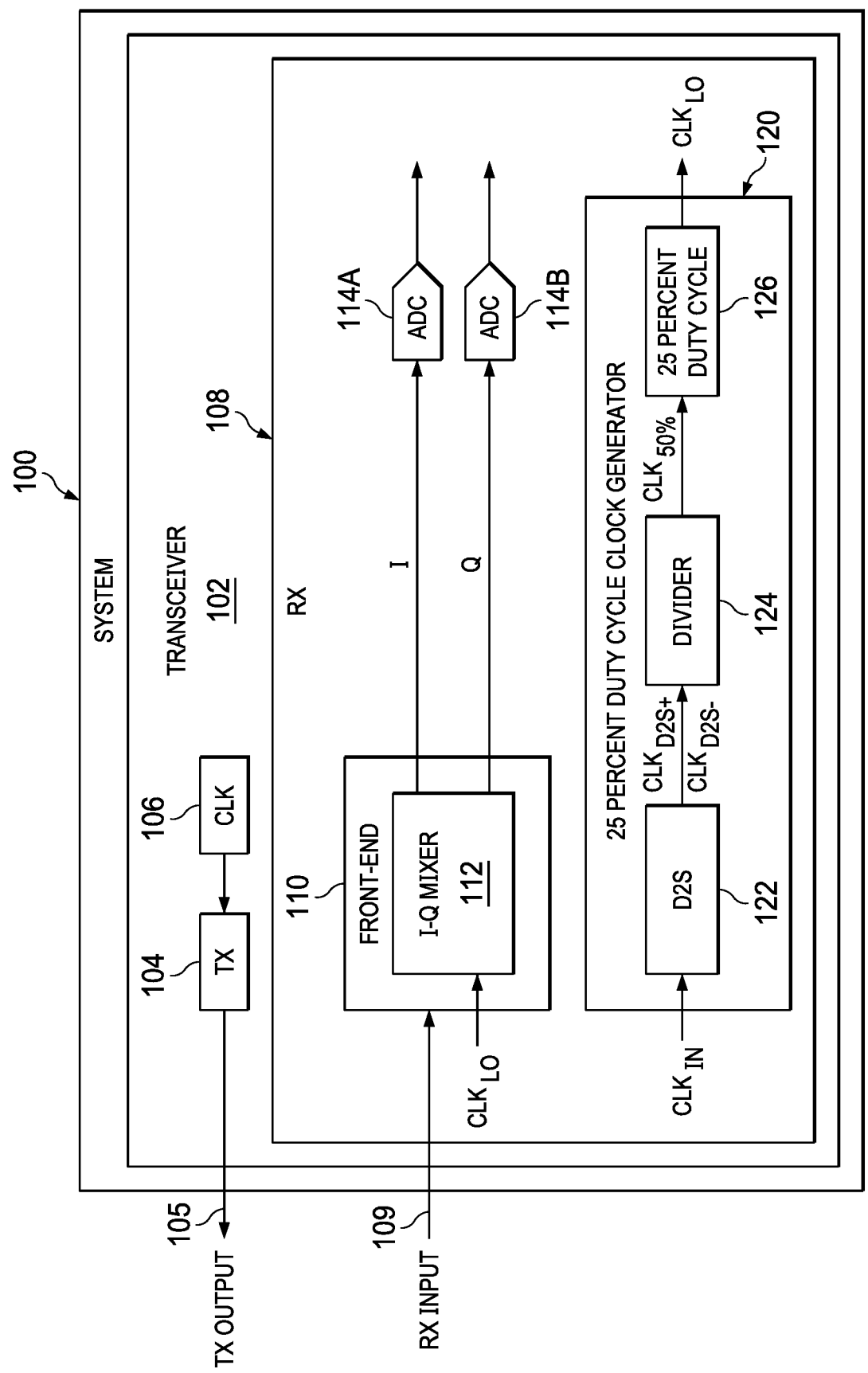
FIG. 1 is a block diagram showing a system in accordance with various examples.

FIG. 1 is a block diagram showing a system 100 in accordance with various examples. In some examples, the system 100 represents an electronic device or consumer product configured to send or receive data via a communication channel (e.g., an optical communication channel, a wired communication channel, or a wireless communication channel). In other examples, the system 100 represents an integrated circuit (system on a chip), or a combination of integrated circuit components and discrete components. As shown in FIG. 1, the system 100 comprises a transceiver 102 with a transmitter 104 and a receiver 108. The transmitter 104 is coupled to a clock generator (CLKGEN) 106 and is configured to provide a transmitter output signal 105 based in part on a clock signal from the clock generator 106. As shown, the receiver 108 include front-end components 110 and ADCs 114A and 114B, where the front-end components 110 include an I-Q mixer 112. In FIG. 1, the I-Q mixer 112 outputs an I-phase signal to the ADC 114A and outputs a Q-phase signal to the ADC 114B. In some examples, the I-phase signal and the Q-phase signal output from the I-Q mixer 112 is based on the RX input signal 109 and 25% duty cycle clock signals ($CLK_{LO}$) provided by a 25% duty cycle clock generator circuit 120.

In at least some examples, the 25% duty cycle clock generator circuit 120 comprises a D2S circuit 122, a divider circuit 124, and a 25% duty cycle circuit 126. More specifically, the D2S circuit 122 provides a first single-ended clock signal ($CLK_{D2S+}$) and a second single-ended clock signal ($CLK_{D2S-}$) based on a differential input clock signal ($CLK_{IN}$). In some examples, the D2S circuit 122 includes self-biased inverters (see e.g., inverters 404 and 408 in FIG. 4). The divider circuit 124 receives $CLK_{D2S+}$ and $CLK_{D2S-}$ from the D2S circuit 122, and generates 50% duty cycle clock signals ($CLK_{50\%}$). The 25% duty cycle circuit 126 receives the $CLK_{50\%}$ signals from the divider circuit 124 and generates 25% duty cycle clock signals ($CLK_{LO}$) for use by the I-Q mixer 112.

In some examples, the divider circuit 124 includes an inverter ring arrangement (see e.g., inverter ring arrangement 502 in FIG. 5) with a first inverter, a second inverter, a third inverter, and a fourth inverter, where an output node of the first inverter is coupled to an input node of the second inverter, an output node of the second inverter is coupled to an input node of the third inverter, an output node of the third inverter is coupled to an input node of the fourth inverter, and an output node of the fourth inverter is coupled to an input node of the first inverter. In operation, the divider circuit 124 uses the falling edges of $CLK_{D2S+}$ and $CLK_{D2S-}$ to generate rising edges of the $CLK_{50\%}$ signals. In contrast, the 25% duty cycle circuit 126 uses rising edges of the $CLK_{50\%}$ signals to generate rising edges and falling edges of the $CLK_{LO}$ signals.

Figure 2:
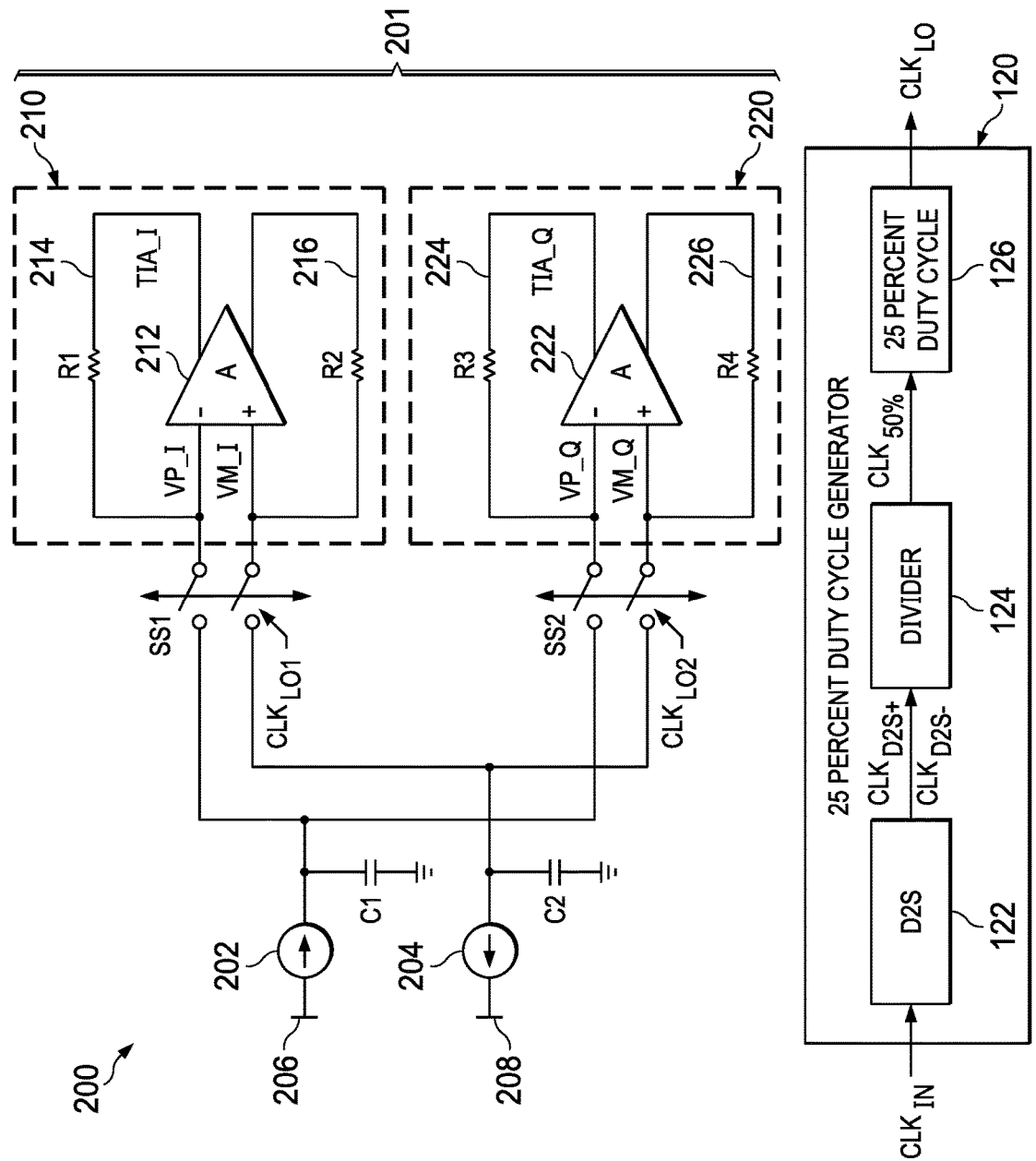
FIG. 2 is a block diagram showing a receiver scenario in accordance with various examples.

FIG. 2 is a block diagram showing a receiver scenario 200 in accordance with various examples. In the receiver scenario 200, an I-Q mixer circuit 201 is represented. As shown, the I-Q mixer circuit 201 a first node 206 that provides a first input signal 202. The I-Q mixer circuit 201 also includes a first set of switches, SS1, where SS1 is controlled by $CLK_{LO1}$ (one of the $CLK_{LO}$ signals output from the 25% duty cycle clock generator circuit 120). Also, the I-Q mixer circuit 201 includes a second node 208 that provides input signal 204. The I-Q mixer circuit 201 also includes a second set of switches, SS2, where SS2 is controlled by $CLK_{LO2}$ (another of the $CLK_{LO}$ signals output from the 25% duty cycle clock generator circuit 120). In operation, SS1 and SS2 perform current mixing operations based on $CLK_{LO1}$ and $CLK_{LO2}$.

In the receiver scenario 200, the I-Q mixer circuit 201 is followed by a transimpedance amplifiers 210 and 220 (labeled TIA_I and TIA_Q in FIG. 2), where TIA_I 210 is coupled to SS1 and TIA_Q 220 is coupled to SS2. More specifically, TIA_I 210 includes a differential operational amplifier 212 with a first resistor, R1, in the negative feedback path 214, and with a second resistor, R2, in the negative feedback path 216. Similarly, TIA_Q 220 includes a differential operational amplifier 222 with a third resistor, R3, in the negative feedback path 224, and with a fourth resistor, R4, in the negative feedback path 226.

For the receiver scenario 200, the I-Q mixer 201 with the 25% duty cycle clock generator circuit 120 represents a 25% duty cycle mixer scenario, which provides higher gains and better I-Q matching compared to 50% duty cycle mixer scenarios. To help ensure the I-Q mixer 201 does not degrade signal-to-noise ratio (SNR) in the receiver scenario 200, low phase noise is needed. Accordingly, the 25% duty cycle clock generator circuit 120 employs various strategies to achieve low phase noise with low power consumption. Also, non-overlapping clocks are needed to achieve good I-Q matching. In the disclosed 25% duty cycle clock generator topologies, 25% duty cycle clocks with very good matching are generated. Matched 25% duty cycle clocks (e.g., matching between $LO_{I0}$, $LO_{I180}$, $LO_{Q90}$ and $LO_{Q270}$) in an I-Q mixer scenario reduce I-Q mismatch and improve $IMD_2/HD_2$ performance. As discussed in the example of FIG. 2, the performance of at least some of the disclosed 25% duty cycle clock generator topologies is decided by the turning off-edges of SS1 and SS2. This is because the operations of SS1 and SS2 do not overlap (e.g., SS1 turns off before SS2 turns on). So the charge in between SS1 and SS2 operations is stored in the parasitic cap at the TIA (transimpedance amplifier) input and goes to the output of TIA_Q when SS2 turns on. Thus, the window in which SS2 acts as on goes from when SS1 turns off to when SS2 turns off. This arrangement helps in design and reducing the area/power.

Figure 4:
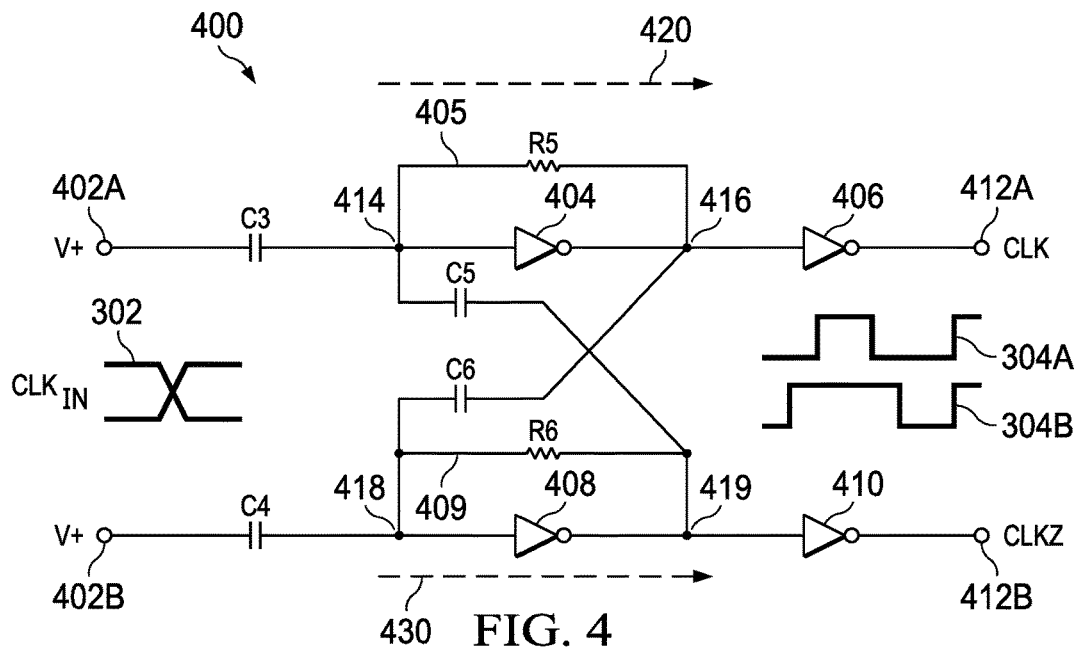
FIG. 4 is a schematic diagram showing a differential-to-single-ended converter (D2S) circuit in accordance with various examples.

For example, in some examples, the D2S circuit 122 includes self-biased inverters (see e.g., inverters 404 and 408 in FIG. 4). In some examples, these self-biased inverters are configured to convert a CML input to rail-to-rail outputs. Also, the divider circuit 124 of the 25% duty cycle clock generator circuit 120 includes an inverter ring arrangement (see e.g., inverter ring arrangement 502 in FIG. 5) with a first inverter, a second inverter, a third inverter, and a fourth inverter, where an output node of the first inverter is coupled to an input node of the second inverter, an output node of the second inverter is coupled to an input node of the third inverter, an output node of the third inverter is coupled to an input node of the fourth inverter, and an output node of the fourth inverter is coupled to an input node of the first inverter. Also, the divider circuit 124 uses the falling edges of $CLK_{D2S+}$ and $CLK_{D2S-}$ (the signals received from the D2S 122) to generate rising edges of the $CLK_{50\%}$ signals. Also, the 25% duty cycle circuit 126 uses rising edges of the $CLK_{50\%}$ signals (the signals received from the divider circuit 124) to generate rising edges and falling edges of the $CLK_{LO}$ signals.

In the receiver scenario 200, only the closing edge of the set of switches SS1 and SS2 for the I-Q mixer 201 determines the performance (I-Q mismatch performance) of this class of mixers. This is because when the set of switches SS1 and SS2 are off, the charge is dumped on to the parasitic cap which is then discharged to the other phase.

Figure 3:
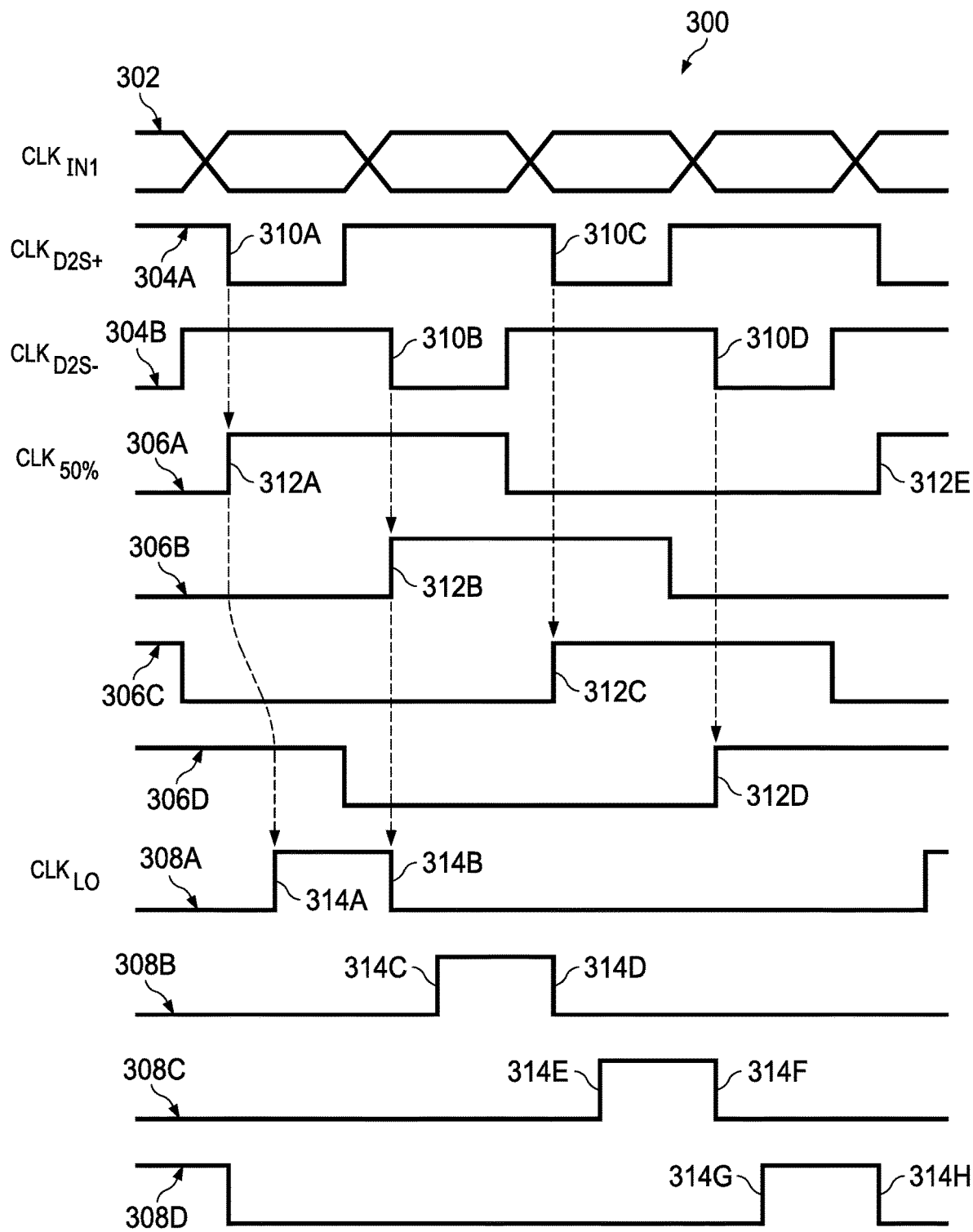
FIG. 3 is a timing diagram showing clock signals related to the receiver scenario of FIG. 2 in accordance with various examples.

FIG. 3 is a timing diagram 300 showing clock signals related to the receiver scenario 200 of FIG. 2 in accordance with various examples. In the timing diagram 300, various signals are represented, including a $CLK_{IN1}$ signal 302 (an example of the differential input clock signal $CLK_{IN}$ input to the D2S circuit 122 in FIGS. 1 and 2), a $CLK_{D2S+}$ signal 304A and a $CLK_{D2S-}$ signal 304B (examples of the single-ended clock signals output from the D2S circuit 122 in FIGS. 1 and 2), $CLK_{50\%}$ signals 306A-306D (examples of the 50% duty cycle clock signals output from the divider circuit 124 in FIGS. 1 and 2), and $CLK_{LO}$ signals 308A-

308D (examples of the 25% duty cycle clock signals output from the 25% duty cycle circuit 126, or the 25% duty cycle clock generator 120 in FIGS. 1 and 2).

In the timing diagram 300, various clock transitions (rising edges or falling edges) are labeled, including the falling edge 310A of the $CLK_{D2S+}$ signal 304A, the falling edge 310B of $CLK_{D2S-}$ signal 304B, the falling edge 310C of the $CLK_{D2S+}$ signal 304A, and the falling edge 310D of the $CLK_{D2S+}$ signals 304B. More specifically, in the timing diagram 300, the falling edge 310A of the $CLK_{D2S+}$ signal 304A is used to generate the rising edge 312A of the $CLK_{50\%}$ signal 306A. Also, the falling edge 310B of the $CLK_{D2S-}$ signal 304B is used to generate the rising edge 312B of the $CLK_{50\%}$ signal 306B. Also, the falling edge 310C of the $CLK_{D2S+}$ signal 304A is used to generate the rising edge 312C of the $CLK_{50\%}$ signal 306C. Also, the falling edge 310D of the $CLK_{D2S-}$ signal 304B is used to generate the rising edge 312D of the $CLK_{50\%}$ signal 306D. As represented in the timing diagram 300, the rising edge 312A of the $CLK_{50\%}$ signal 306A is used to generate the rising edge 314A of the $CLK_{LO}$ signal 308A. Also, the rising edge 312B of the $CLK_{50\%}$ signal 306B is used to generate the falling edge 314B of the $CLK_{LO}$ signal 308A. The rising edge 312B of the $CLK_{50\%}$ signal 306B is used to generate the rising edge 314C of the $CLK_{LO}$ signal 308B. Also, the rising edge 312C of the $CLK_{50\%}$ signal 306C is used to generate the falling edge 314D of the $CLK_{LO}$ signal 308B. The rising edge 312C of the $CLK_{50\%}$ signal 306C is used to generate the rising edge 314E of the $CLK_{LO}$ signal 308C. Also, the rising edge 312D of the $CLK_{50\%}$ signal 306D is used to generate the falling edge 314F of the $CLK_{LO}$ signal 308C. The rising edge 312D of the $CLK_{50\%}$ signal 306D is used to generate the rising edge 314G of the $CLK_{LO}$ signal 308D. Also, the rising edge 312E of the $CLK_{50\%}$ signal 306A is used to generate the falling edge 314H of the $CLK_{LO}$ signal 308D.

FIG. 4 is a schematic diagram showing a D2S circuit 400 (an example of the D2S circuit 122 in FIGS. 1 and 2) in accordance with various examples. As shown, the D2S circuit 400 includes differential input nodes 402A and 402B configured to receive a differential input clock signal such as the $CLK_{IN}$ signal 302. As shown, the D2S circuit 400 also includes self-biased inverters 404 and 408. More specifically, self-biasing for the self-biased inverter 404 is achieved using a feedback path 405 with a resistor, R5, between the input node 414 to the self-biased inverter 404 and the output node 416 from the self-biased inverter 404. Meanwhile, self-biasing for the self-biased inverter 408 is achieved using a feedback path 409 with a resistor, R6, between the input node 418 to the self-biased inverter 408 and the output node 419 from the self-biased inverter 408. In some examples, the self-biased inverters 404 and 408 are configured to convert a CML input to rail-to-rail outputs.

As shown in FIG. 4, the self-biased inverter 404 is part of a first path 420 used to provide the $CLK_{D2S+}$ signal 304A. Meanwhile, the self-biased inverter 408 is part of a second path 430 used to provide the $CLK_{D2S-}$ signal 304B. More specifically, the first path 420 includes the first differential input node 402A, a capacitor (C3), the self-biased inverter 404, and a first subsequent inverter 406, where the output of the first subsequent inverter 406 is the $CLK_{D2S+}$ signal 304A at a single-ended clock signal node 412A. The second path 430 includes the second differential input node 402B, a capacitor (C4), the self-biased inverter 408, and a second subsequent inverter 410, where the output of the second subsequent inverter 410 is the $CLK_{D2S-}$ signal 304B at a single-ended clock signal node 412B. In some examples, the D2S circuit 400 also comprises a third capacitor (C5) and a fourth capacitor (C6), where C5 is coupled between the input node 414 of the first self-biased inverter 404 and the output node 419 of the second self-biased inverter 408, and where C6 is coupled between the input node 418 of the second self-biased inverter 408 and the output node 416 of the first self-biased inverter 404 which helps in reducing the input loading of the D2S circuit and thus helps improve the noise performance. Also, when the D2S circuit only uses self-bias inverters, no biasing circuit is required, thus reducing the need of bias-filters and thus improving low-frequency phase-noise.

Figure 5:
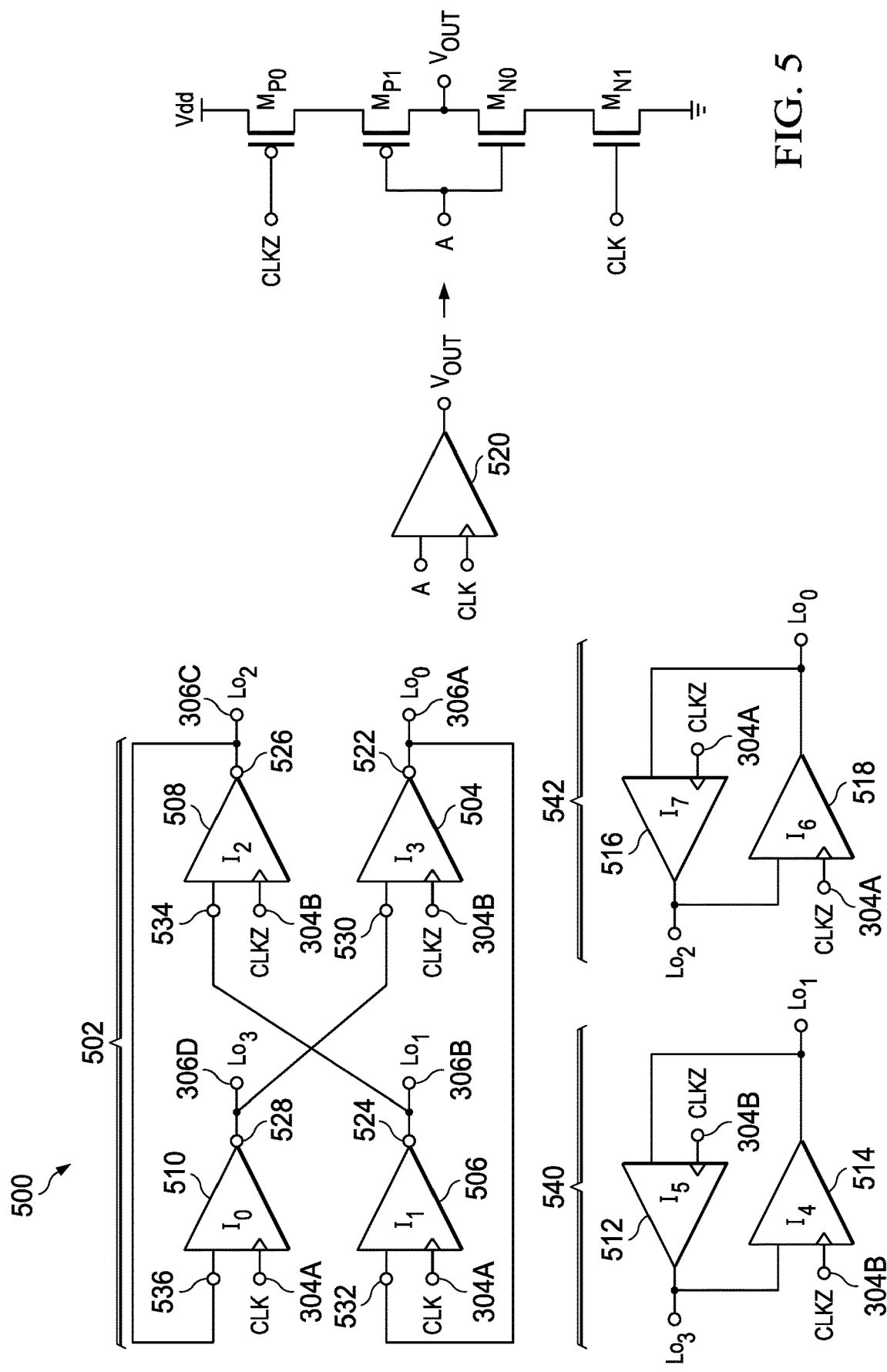
FIG. 5 is a schematic diagram showing a divider circuit in accordance with various examples.

FIG. 5 is a schematic diagram showing a divider circuit 500 (an example of the divider circuit 124 in FIGS. 1 and 2) in accordance with various examples. As shown, the divider circuit 500 includes an inverter ring arrangement 502 that includes a first inverter 504, a second inverter 506, a third inverter 508, and a fourth inverter 510. More specifically, an output node 522 of the first inverter 504 is coupled to an input node 532 of the second inverter 506. Also, an output node 524 of the second inverter 506 is coupled to an input node 534 of the third inverter 508. Also, an output node 526 of the third inverter 508 is coupled to an input node 536 of the fourth inverter 510. Also, an output node 528 of the fourth inverter 510 is coupled to an input node 530 of the first inverter 504. Also, the first inverter 504 and the third inverter 508 are clocked by a clock signal, CLKZ, where the $CLK_{D2S-}$ signal 304B is an example of CLKZ in FIG. 5. Also, the second inverter 506 and the fourth inverter 510 are clocked by a clock signal, CLK, where the $CLK_{D2S+}$ signal 304A is an example of CLK in FIG. 5.

The divider circuit 500 also comprises a set of inverters 540 that includes inverters 512 and 514, where the output of inverter 512 is the input to the inverter 514, and where the output of the inverter 514 is the input to the inverter 512. Also, the inverters 512 and 514 are clocked by the CLKZ signal of FIG. 5 (e.g., the $CLK_{D2S-}$ signal 304B). The divider circuit 500 also comprises another set of inverters 542 that includes inverters 516 and 518, where the output of inverter 516 is the input to the inverter 518, and where the output of the inverter 518 is the input to the inverter 516. Also, the inverters 516 and 518 are clocked by the CLK signal of FIG. 5 (e.g., the $CLK_{D2S+}$ signal 304A).

With the divider circuit 500, the inverters 504, 506, 508, and 510 (labeled $I_0$-$I_3$ in FIG. 5) generate the four phases (labeled $Lo_0$-$Lo_3$ in FIG. 5) of the 50% duty cycle outputs. Also, the inverters 512, 514, 516, and 518 (labeled $I_4$-$I_7$) are used to hold the outputs when the corresponding clock is off. This is to account for leakage/coupling to these nodes during the off state. In some examples, these inverters 512, 514, 516, and 518 ($I_4$-$I_7$) are made much weaker (smaller in size or lower in drive-strength) than the inverters 504, 506, 508, and 510 ($I_0$-$I_3$). During SYNC operations, CLK is held low and CLKZ is held high using the D2S circuit. Also, $Lo_3$ is initiated to a particular state during this time using a series switch in the pull-up/pull-down path of the inverter 512 ($I_5$). This will ensure that all other nodes of the inverter ring arrangement 502 are set to the correct state. SYNC is then released in the negative edge of CLK and then the inverter ring arrangement 502 operates as desired, generating four phases of 50% duty cycle outputs (e.g., the $CLK_{50\%}$ signals 306A-306D). Since the series switches are added in the auxiliary path, it does not affect the high speed normal path. The series switches correspond to an extra transistor (e.g., PMOS) in series or in stack with the clocked inverter structure 520 (on top of $MP_0$ and below Vdd) shown in FIG.

5 and adding a parallel NMOS at the output $V_{out}$ of the clocked inverter structure 520. Both of these MOS gates will be controlled by SYNC.

In operation, the divider circuit 500 is configured to generate four 50% clock signals, such as the $CLK_{50\%}$ signals 306A-306D, using CLKZ and CLK in FIG. 5 (e.g., the $CLK_{D2S+}$ signal 304A and the $CLK_{D2S-}$ signal 304B), where each of the four 50% clock signals having a different phase. As shown in FIG. 3, the frequency for the $CLK_{50\%}$ signals 306A-306D is half of the differential input clock signal (e.g., the $CLK_{IN}$ 302 in FIG. 3) received by the D2S circuit (e.g., the D2S circuit 122 in FIGS. 1 and 2, or the D2S circuit 400 in FIG. 4). Also, in some examples, the divider circuit 500 is configured to generate four 50% duty cycle clock signals (e.g., the $CLK_{50\%}$ signals 306A-306D) using falling edges of the first and second clock signals (e.g., CLK and CLKZ in FIG. 5, or the $CLK_{D2S+}$ signal 304A and the $CLK_{D2S-}$ signal 304B in FIG. 3).

Figure 6:
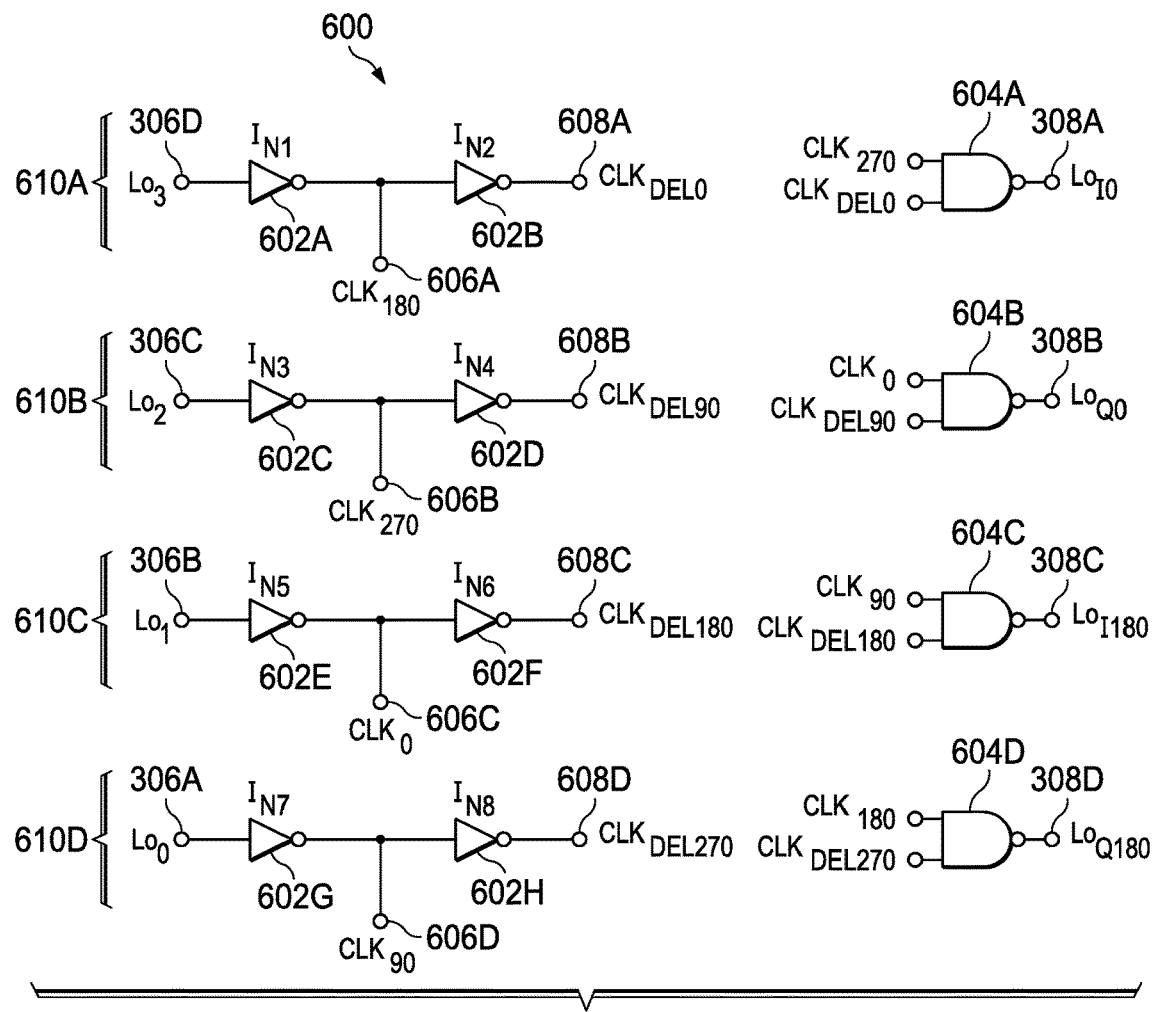
FIG. 6 is a schematic diagram showing a 25% duty cycle circuit in accordance with various examples.

FIG. 6 is a schematic diagram showing a 25% duty cycle circuit 600 (an example of the 25% duty cycle circuit 126 in FIGS. 1 and 2) in accordance with various examples. As shown, the 25% duty cycle circuit 600 comprises a first clock signal path 610A with a first inverter 602A (labeled $I_{N1}$) and a second inverter 602B (labeled $I_{N2}$), where the first clock signal path 610A is configured to receive a first of the four 50% clock signals (e.g., $CLK_{50\%}$ signal 306D). The 25% duty cycle circuit 600 also comprises a second clock signal path 610B with a third inverter 602C (labeled $I_{N3}$) and a fourth inverter 602D (labeled $I_{N4}$), where the second clock signal path 610B is configured to receive a second of the four 50% clock signals (e.g., $CLK_{50\%}$ signal 306C). The 25% duty cycle circuit 600 also comprises a third clock signal path 610C with a fifth inverter 602E (labeled $I_{N5}$) and a sixth inverter 602F (labeled $I_{N6}$), where the third clock signal path 610C is configured to receive a third of the four 50% clock signals (e.g., $CLK_{50\%}$ signal 306B). The 25% duty cycle circuit 600 also comprises a fourth clock signal path 610D with a seventh inverter 602G (labeled $I_{N7}$) and an eighth inverter 602H (labeled $I_{N8}$), where the fourth clock signal path 610D is configured to receive a fourth of the four 50% clock signals (e.g., $CLK_{50\%}$ signal 306A).

As shown in FIG. 6, the first clock signal path 610A of the 25% duty cycle circuit 600 also includes a NAND gate 604A. Similarly, the second clock signal path 610B of the 25% duty cycle circuit 600 includes a NAND gate 604B, the third clock signal path 610C of the 25% duty cycle circuit 600 includes a NAND gate 604C, and the fourth clock signal path 610D of the 25% duty cycle circuit 600 includes a NAND gate 604D. More specifically, the first NAND gate 604A in the first clock signal path 610A is configured to receive an output (labeled $CLK_{DEL0}$) of the second inverter 602B ($I_{N2}$) and an output (labeled $CLK_{270}$) of the third inverter 602C ($I_{N3}$) as inputs. Also, the second NAND gate 604B in the second clock signal path 610B is configured to receive an output (labeled $CLK_{DEL90}$) of the fourth inverter 602D ($I_{N4}$) and an output (labeled $CLK_0$) of the fifth inverter 602E ($I_{N5}$) as inputs. Also, the third NAND gate 604C in the third clock signal path 610C is configured to receive an output (labeled $CLK_{DEL180}$) of the sixth inverter 602F ($I_{N6}$) and an output (labeled $CLK_{90}$) of the seventh inverter 602G ($I_{N7}$) as inputs. Also, the fourth NAND gate 604D in the fourth clock signal path 610D is configured to receive an output (labeled $CLK_{DEL270}$) of the eighth inverter 602H ($I_{N8}$) and an output (labeled $CLK_{180}$) of the first inverter 602A ($I_{N1}$) as inputs. In the 25% duty cycle circuit 600, the outputs from the NAND gates 604A-604A correspond to 25% duty cycle clock signals (e.g., the $CLK_{25\%}$ signals 308A-308D).

In some examples, the offset or non-overlap for the 25% duty cycle clock signals (e.g., the $CLK_{25\%}$ signals 308A-308D) generated by the 25% duty cycle circuit 600 is created by adding extra inverters (e.g., $I_{N2}$, $I_{N4}$, $I_{N6}$, $I_{N8}$) in the falling edge path for each output. This creates active low outputs with non-overlapping zeros for PMOS type mixer switches. The non-overlap time can be increased or reduced by skewing the extra inverters (e.g., $I_{N2}$, $I_{N4}$, $I_{N6}$, $I_{N8}$).

FIG. 7 is a timing diagram 700 showing clocks signals related to a 25% duty cycle clock generator (e.g., the 25% duty cycle clock generators 120 in FIGS. 1 and 2) in accordance with various examples. In the timing diagram 700, clock signals 710A and 710B correspond to divider circuit inputs (e.g., the inputs to the divider circuit 124 in FIGS. 1 and 2, or the inputs to the divider circuit 500 of FIG. 5). In some examples, the clock signals 710A and 710B are examples of the $CLK_{D2S+}$ signal 304A and the $CLK_{D2S-}$ signal 304B discussed previously. Also, the clock signals 712A-712D correspond to divider circuit outputs 704 (e.g., the outputs from the divider circuit 124 in FIGS. 1 and 2, or the outputs from the divider circuit 500 of FIG. 5). In some examples, the clock signals 712A-712D are examples of the $CLK_{50\%}$ signals 306A-306D discussed previously. Also, the clock signals 714A-714D correspond to 25% duty cycle circuit outputs 708 (e.g., the outputs from the 25% duty cycle circuit 126 in FIGS. 1 and 2, or the outputs from the 25% duty cycle circuit 600 of FIG. 6). In some examples, the clock signals 714A-714D are examples of the $CLK_{25\%}$ signals 308A-308D discussed previously.

With the disclosed 25% duty cycle clock generator topologies, I-Q mixer output edges are determined only by rising edges of $Lo_0$-$Lo_3$ in FIGS. 5 and 6 ($Lo_0$-$Lo_3$ are examples of the $CLK_{50\%}$ signals 306A-306D) which in turn depends only on the falling edges of CLK and CLKZ in FIGS. 4 and 5 (CLK and CLKZ are examples of the $CLK_{D2S+}$ signal 304A and the $CLK_{D2S-}$ signal 304B). Since the differential duty cycle of the incoming clocks are maintained by a D2S circuit (e.g., the D2S circuit 122 in FIGS. 1 and 2, or the D2S circuit 400 in FIG. 4), all the four pulses are well matched. This results in very good I-Q mismatch and $IMD_2$/$HD_2$ (intermodulation distortion/harmonic distortion) performance.

In some examples, for a PMOS type mixer, the rising edge of the 50% duty cycle clock signals (e.g., the $CLK_{50\%}$ signals 306A-306D) is the critical edge. Thus, in some examples, the edges determining the rising edge of the 50% duty cycle clock signals (e.g., the $CLK_{50\%}$ signals 306A-306D) pass through minimum number of inverters and thus the addition of non-overlap time does not degrade the noise/mismatch of the 25% duty cycle clock signals (e.g., the $CLK_{25\%}$ signals 308A-308D). Also, it should be appreciated that the setup/hold time of the 25% duty cycle clock generator topologies described herein (e.g., the 25% duty cycle clock generator circuits 120 in FIGS. 1 and 2, and circuit 500 in FIG. 5) is low as the 25% duty cycle clock generator topology uses only clocked inverters. Also, the delays of the clocked inverters are low resulting in high speed operation of the 25% duty cycle clock generator topologies described herein (e.g., the 25% duty cycle clock generator circuits 120 in FIGS. 1 and 2, and circuits 400, 500, and 600 in FIGS. 4-6). Also, at each of various inverters (e.g., $I_{0-6}$, $I_{N1-N8}$ and inventors 406,410) only one of the rising/falling edges is important. Thus, all these inverters can be skewed to improve that edge leading to better performance at lower area and power.

In at least some of the proposed 25% duty cycle clock generator topologies described herein (e.g., the 25% duty cycle clock generator circuits 120 in FIGS. 1 and 2, and circuits 400, 500, and 600 in FIGS. 4-6), $2*F_{LO}$ clock signals (where $F_{LO}$ is the frequency of the local oscillator) are generated using a PLL and are routed in CML mode. The $2*F_{LO}$ signal is then converted to rail-to-rail outputs (e.g., the $CLK_{D2S+}$ signal 304A and the $CLK_{D2S-}$ signal 304B described herein) using two AC-coupled inverters. Since CML single-ended rise/fall times are mismatched, the single ended rise/fall times of the D2S outputs will be mismatched but the differential duty cycle is preserved. This D2S output (e.g., the $CLK_{D2S+}$ signal 304A and the $CLK_{D2S-}$ signal 304B described herein) is then used to generate four phases of 50% duty cycle clocks (e.g., the $CLK_{50\%}$ signals 306A-306D described herein) using a ring inverter arrangement (e.g., the ring inverter arrangement 502 in FIG. 5). This results in fast operation and lower noise due to lower number of components and lower delay and setup/hold times.

In some examples, the 25% duty cycle clock signals output from the 25% duty cycle clock generator (e.g., the $CLK_{25\%}$ signals 308A-308D described herein) are generated using inverters and NAND gates for PMOS typed mixers (see e.g., the 25% duty cycle circuit 600 in FIG. 6) such that the 25% duty cycle clock signals depend only on the falling edges of CLK and CLKZ in FIGS. 4 and 5 (e.g., the $CLK_{D2S+}$ signal 304A and the $CLK_{D2S-}$ signal 304B described herein). This result in better matching of the four phases generated. Non-overlap time is added by putting extra inverters (e.g., $I_{N2}$, $I_{N4}$, $I_{N6}$, $I_{N8}$ in FIG. 6) in the falling edge path of the NAND gates. These extra inverters (e.g., $I_{N2}$, $I_{N4}$, $I_{N6}$, $I_{N8}$ in FIG. 6) can be skewed to reduce/increase the non-overlap time. Also, the extra inverters (e.g., $I_{N2}$, $I_{N4}$, $I_{N6}$, $I_{N8}$ in FIG. 6) are not in the critical edge path (e.g., the rising edge for PMOS mixers). As desired, a SYNC is done for inverters of the divider circuit (e.g., the divider circuit 124 in FIGS. 1 and 2, or the divider circuit 500 in FIG. 5) using an auxiliary path and does not degrade the speed of the normal path resulting in high speed operation. In a NMOS mixer scenario, outputs will be active high and will have non-overlapping high states. This can be achieved by using AND gates instead of NAND gates 604A-604D. Also, in some examples, 2*flo (where "flo" is frequency of the local oscillator) is generated in a PLL and is routed in CML, resulting in easier PLL design and power saving in CML. Also, this routing preserves differential duty cycle.

In at least some of the proposed 25% duty cycle clock generator topologies, the design criteria targets minimization of power dissipated and area occupied, while maintaining good I-Q mismatch, noise performance and $IMD_2/HD_2$ performance. In some examples, a $2*F_{LO}$ clock is generated from a PLL and is routed to a receiver (e.g., the receiver 108 in FIG. 1) in CML domain. Two self-biased inverters are used to convert the CML outputs to two rail-to-rail outputs (see e.g., the D2S circuit 400 of FIG. 4). This structure consumes much lower power compared to a conventional D2S. Note: the CML will have different rise and fall times for single-ended output, but differentially they will be the same. This causes a skew in duty cycle of the single-ended output but maintains the differential duty cycle, i.e., the time between fall edges of the clocks generated will be same.

Figure 8:
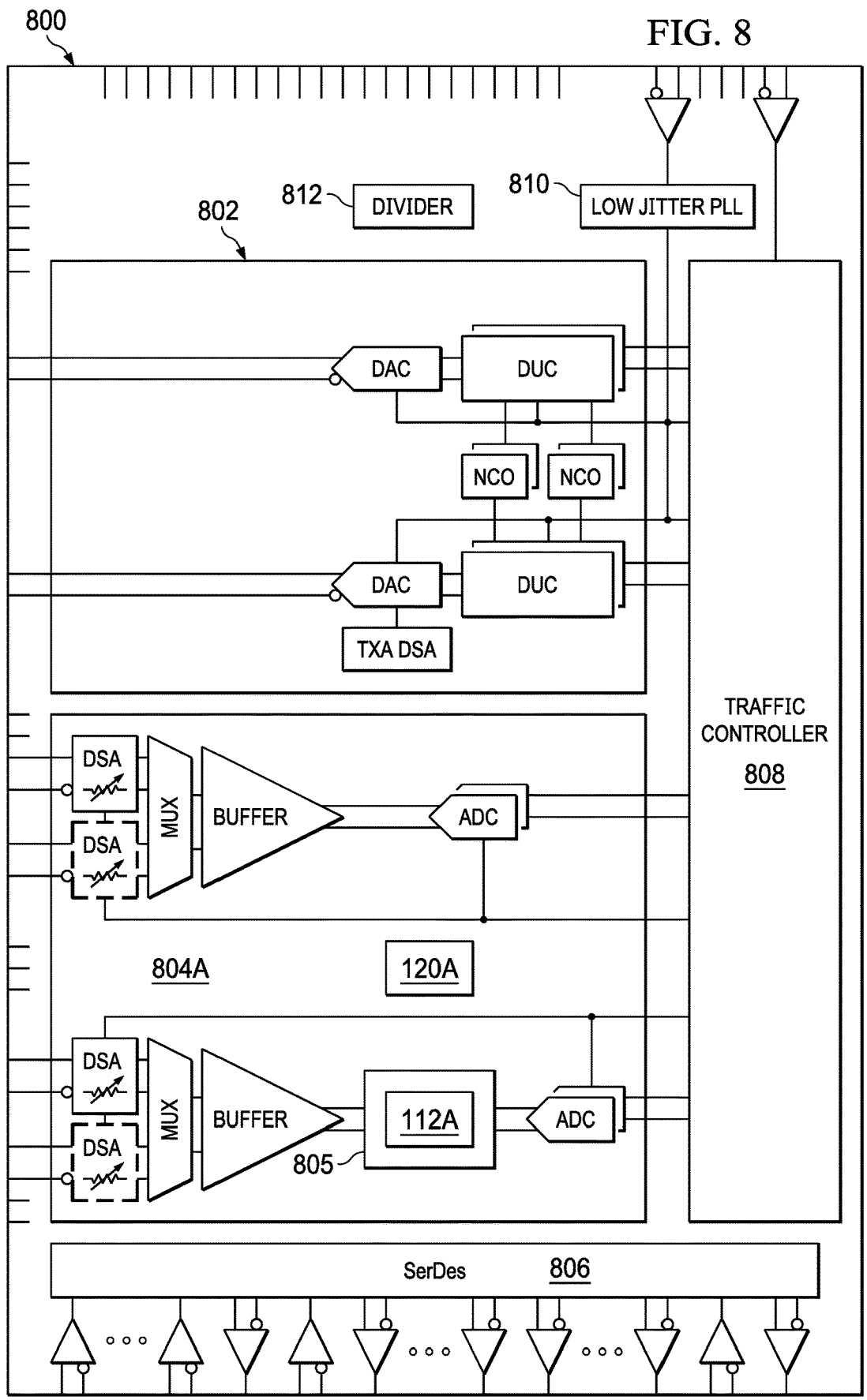
FIG. 8 is a block diagram showing a transceiver device in accordance with various examples.

FIG. 8 is a block diagram showing a transceiver device 800 in accordance with various examples. In different examples, the transceiver device 800 corresponds to an integrated circuit, a chip, a multi-die module, and/or a combination of integrated circuit components and discrete components. In FIG. 8, the transceiver device 800 includes a transmitter block 802, and a receiver block 804. As shown, the transmitter block 802 includes components such as DACs, digital up converters (DUCs), numerically controlled oscillators (NCOs), and digital step attenuator (DSA) components. Meanwhile, the receiver block 804 includes components such as DSA components, multiplexers, a buffer, a mixer and TIA block 805, an I-phase ADC, and a Q-phase ADC. Also, the receiver block includes an I-Q mixer 112A (an example of the I-Q mixer 112 in FIG. 1) and a 25% duty cycle clock generator circuit 120A (an example of the 25% duty cycle clock generator circuit 120 in FIGS. 1 and 2). In some examples, the transceiver device 800 also includes components such as a serializer/deserializer 806, a traffic controller 808, a phase-locked loop 810, a divider 812, buffers, and/or other components.

The transceiver device 800 is only an example, and is not intended to limit use of I-Q mixers and the proposed 25% duty cycle clock generator topologies to a particular transceiver device. In different examples, a 25% duty cycle clock generator as described herein is used with single channel or multi-channel transceiver devices for use with optical communication channels, single channel or multi-channel transceiver devices for use with wired communication channels, and single channel or multi-channel transceiver devices for use with wireless communication channels.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A receiver device having:
    an I-Q mixer circuit having an I-phase signal and a Q-phase signal;
    a first analog-to-digital converter (ADC) circuit configured to digitize the I-phase signal;
    a second ADC circuit configured to digitize the Q-phase signal; and
    a 25% duty cycle clock generator circuit configured to provide 25% duty cycle clock signals to the I-Q mixer, wherein the 25% duty cycle clock generator circuit comprises a divider circuit with an inverter ring arrangement;
    wherein the 25% duty cycle clock generator circuit further comprises a differential-to-single ended converter (D2S) circuit coupled to inputs of the divider circuit, wherein the D2S circuit comprises self-biased inverters.

2. The receiver device of claim 1, wherein the D2S circuit comprises:
a first path with a first differential input, a first capacitor, a first self-biased inverter, and a first subsequent inverter, wherein an output of the first subsequent inverter is a first clock signal; and
a second path with a second differential input, a second capacitor, a second self-biased inverter, and a second subsequent inverter, wherein an output of the second subsequent inverter is a second clock signal with transitions that are offset from transitions of the first clock signal.

3. The receiver device of claim 2, wherein the D2S circuit further comprises:
a third capacitor coupled between an input of the first self-biased inverter and an output of the second self-biased inverter; and
a fourth capacitor coupled between an input of the second self-biased inverter and an output of the first self-biased inverter.

4. The receiver device of claim 2, wherein the self-biased inverters are configured to convert a current mode logic (CML) input signal of $2*F_{LO}$ to rail-to-rail outputs, where $F_{LO}$ is the local oscillator frequency.

5. The receiver device of claim 2, wherein the divider circuit is configured to generate four 50% duty cycle clock signals using only falling edges of the first and second clock signals, each of the four 50% duty cycle clock signals having a different phase.

6. The receiver device of claim 2, wherein I-Q mixer comprises two sets of switches, and wherein only the closing edges of the two sets of switches determines I-Q mismatch performance, noise performance, and intermodulation distortion/harmonic distortion ($IMD_2/HD_2$) performance for the I-Q mixer.

7. The receiver device of claim 6, wherein the 25% duty cycle clock generator further comprises a 25% duty cycle circuit coupled to outputs of the divider, wherein the 25% duty cycle circuit is configured to generate rising and falling edges of four 25% duty cycle clock signals using only rising edges of the four 50% clock signals.

8. The receiver device of claim 7, wherein the 25% duty cycle circuit comprises:
a first clock signal path with a first inverter and a second inverter, wherein the first clock signal path is configured to receive a first of the four 50% clock signals;
a second clock signal path with a third inverter and a fourth inverter, wherein the second clock signal path is configured to receive a second of the four 50% clock signals;
a third clock signal path with a fifth inverter and a sixth inverter, wherein the third clock signal path is configured to receive a third of the four 50% clock signals;
a fourth clock signal path with a seventh inverter and an eighth inverter, wherein the fourth clock signal path is configured to receive a fourth of the four 50% clock signals.

9. The receiver device of claim 8, wherein the 25% duty cycle circuit further comprises:
a first NAND gate in the first clock signal path, wherein the first NAND gate is configured to receive an output of the second inverter and an output of the third inverter as inputs;
a second NAND gate in the second clock signal path, wherein the second NAND gate is configured to receive an output of the fourth inverter and an output of the fifth inverter as inputs;
a third NAND gate in the third clock signal path, wherein the third NAND gate is configured to receive an output of the sixth inverter and an output of the seventh inverter as inputs; and
a fourth NAND gate in the fourth clock signal path, wherein the fourth NAND gate is configured to receive an output of the eighth inverter and an output of the first inverter as inputs.

10. A 25% duty cycle clock generator circuit, comprising:
a divider circuit, wherein the divider circuit comprises:
a first inverter;
a second inverter;
a third inverter; and
a fourth inverter,
wherein an output of the first inverter is coupled to an input of the second inverter, an output of the second inverter is coupled to an input of the third inverter, an output of the third inverter is coupled to an input of the fourth inverter, and an output of the fourth inverter is coupled to an input of the first inverter;
wherein further comprises a differential-to-single ended converter (D2S) circuit coupled to inputs of the divider circuit, wherein the D2S circuit comprises self-biased inverters.

11. The 25% duty cycle clock generator circuit of claim 10, wherein the D2S circuit comprises:
a first path with a first differential input, a first capacitor, a first self-biased inverter, and a first subsequent inverter, wherein the output of the first subsequent inverter is a first single-ended clock signal; and
a second path with a second differential input, a second capacitor, a second self-biased inverter, and a second subsequent inverter, wherein the output of the second subsequent inverter is a second single-ended clock signal.

12. The 25% duty cycle clock generator circuit of claim 11, wherein the D2S circuit further comprises:
a third capacitor coupled between an input of the first self-biased inverter and an output of the second self-biased inverter; and
a fourth capacitor coupled between an input of the second self-biased inverter and an output of the first self-biased inverter.

13. The 25% duty cycle clock generator circuit of claim 11, wherein the divider circuit is configured to generate four 50% clock signals using only falling edges of the first and second clock signals, each of the four 50% clock signals having a different phase.

14. The 25% duty cycle clock generator circuit of claim 13, further comprising a 25% duty cycle circuit coupled to outputs of the divider, wherein the 25% duty cycle circuit is configured to generate rising and falling edges of four 25% duty cycle clock signals using only rising edges of the four 50% clock signals.

15. The 25% duty cycle clock generator circuit of claim 14, wherein the 25% duty cycle circuit comprises:
a first clock signal path with a first inverter and a second inverter, wherein the first clock signal path is configured to receive a first of the four 50% clock signals;
a second clock signal path with a third inverter and a fourth inverter, wherein the second clock signal path is configured to receive a second of the four 50% clock signals;

a third clock signal path with a fifth inverter and a sixth inverter, wherein the third clock signal path is configured to receive a third of the four 50% clock signals;

a fourth clock signal path with a seventh inverter and an eighth inverter, wherein the fourth clock signal path is configured to receive a fourth of the four 50% clock signals.

16. The 25% duty cycle clock generator circuit of claim 15, wherein the 25% duty cycle circuit further comprises:

a first NAND gate in the first clock signal path, wherein the inputs for the first NAND gate includes an output of the second inverter and an output of the third inverter;

a second NAND gate in the second clock signal path, wherein the inputs for the second NAND gate include an output of the fourth inverter and an output of the fifth inverter as inputs;

a third NAND gate in the third clock signal path, wherein the inputs for the third NAND gate include an output of the sixth inverter and an output of the seventh inverter as inputs; and a fourth NAND gate in the fourth clock signal path, wherein the inputs for the fourth NAND gate include an output of the eighth inverter and an output of the first inverter as inputs.

17. The 25% duty cycle clock generator circuit of claim 10, wherein the self-biased inverters convert a current mode logic (CML) input to rail-to-rail outputs.

* * * * *